United States Patent [19]
Mokhtar et al.

[11] Patent Number: 6,111,466
[45] Date of Patent: Aug. 29, 2000

[54] AMPLIFIER WITH FEEDBACK TO PROVIDE BIAS ADJUSTMENT

[75] Inventors: Fuad Mokhtar, Kedah; Mirza Noor; Samsun Zaini Basri, both of Penang, all of Malaysia

[73] Assignee: Motorola, Inc., Schaumburg, Ill.

[21] Appl. No.: 09/274,030

[22] Filed: Mar. 22, 1999

[51] Int. Cl.[7] .................................................. H03F 3/04
[52] U.S. Cl. ................................... 330/296; 330/300
[58] Field of Search .............................. 330/86, 110, 132, 330/296, 300, 140

[56] References Cited

U.S. PATENT DOCUMENTS

| | | | |
|---|---|---|---|
| 3,060,326 | 10/1962 | Watson | 307/88.5 |
| 5,406,225 | 4/1995 | Iida et al. | 330/279 |
| 5,789,983 | 8/1998 | Fujita | 330/277 |
| 5,982,236 | 11/1999 | Ishikawa | 330/296 |
| 5,986,509 | 11/1999 | Lohninger | 330/290 |

FOREIGN PATENT DOCUMENTS

| | | | |
|---|---|---|---|
| 5-327358 | 12/1993 | Japan | 330/296 |

*Primary Examiner*—Robert Pascal
*Assistant Examiner*—Henry Choe
*Attorney, Agent, or Firm*—Barbara R. Doutre

[57] ABSTRACT

An amplifier (1) having an amplifier transistor (Tr1) with a gate (G) and drain (D). A feedback circuit (2) couples the drain (D) to the gate (G). The feedback circuit (2) has a direct current blocking capacitor (C1) and low pass filter (R3,C2) with a rectifier (D1) therebetween. In use, radio frequency signals at the drain (D) are processed by the feedback circuit (2) to provide a direct current bias to the gate(G). This bias is dependent upon variations of the radio frequency signals at the drain (D).

12 Claims, 1 Drawing Sheet

AMPLIFIER WITH FEEDBACK TO PROVIDE BIAS ADJUSTMENT

FIELD OF THE INVENTION

This invention relates to an amplifier with feedback to provide bias adjustment. The invention is particularly useful for, but not necessarily limited to, radio frequency power amplifiers typically used in microprocessor controlled radios.

BACKGROUND ART

Conventional radio frequency power amplifiers that typically use field effect transistors have an optimal gate to source voltage operating point where the output power and gain are at the maximum. This operating point is related to input drive signal frequency. However, such conventional radio frequency power amplifiers have a pre-set substantially constant gate to source voltage and therefore it is not possible to maintain maximum, or near maximum, gain and output power over a wide range of input signal frequencies. In addition, conventional radio frequency power amplifiers have an associated pre-set voltage bias circuitry, typically comprising a Digital to Analogue converter when the amplifier is part of a microprocessor controlled radio. This bias circuitry is relatively expensive and the bias has to individually set for each manufactured amplifier, this can be time consuming and the bias is susceptible to drift.

SUMMARY OF THE INVENTION

It is an object of the present invention to overcome or alleviate at least one of the problems associated with biasing of amplifiers.

According to one aspect of the invention there is provided an amplifier including:

- at least one amplifier transistor with a control input and an output; and
- a feedback circuit coupling said output to said control input, said feedback circuit having a direct current blocking component and low pass filter circuitry with a rectifier there between,
- wherein, in use, radio frequency signals at said output are processed by said feedback circuit to provide a direct current bias to said control input, said direct current bias being dependent upon variations of said radio frequency signals at said output.

Preferably, said amplifier may be further characterised by said direct current bias being dependent upon amplitude variations of said radio frequency signals at said output.

Suitably, said amplifier may be further characterised by said direct current bias also being also dependent upon frequency variations of said radio frequency signals at said output.

Preferably, said control input may be coupled to a potential divider circuit, wherein a first part of said potential divider circuit comprises part of said feedback circuit.

Suitably, a second part of said potential divider circuit may be coupled to ground.

Preferably, there may be bias limiting circuitry associated with said feedback circuit, said bias limiting circuitry being configured to limit the maximum direct current bias provided to said input.

Suitably, said bias limiting circuitry may include at least one voltage regulating transistor in said feedback circuit.

Preferably, said output may be coupled to a direct current voltage supply by a radio frequency choke.

Suitably, said rectifier may be a diode having an anode coupled to ground and cathode coupled to both said direct current blocking component and said filter circuitry.

Preferably, said direct current blocking component may include a capacitor.

BRIEF DESCRIPTION OF THE DRAWINGS

In order that the present invention may be readily understood and put into practical effect, reference will now be made to a preferred embodiment illustrated in the accompanying drawings in which.

DETAILED DESCRIPTION OF THE PREFERRED EMBODIMENT OF THE INVENTION

Figure 1:
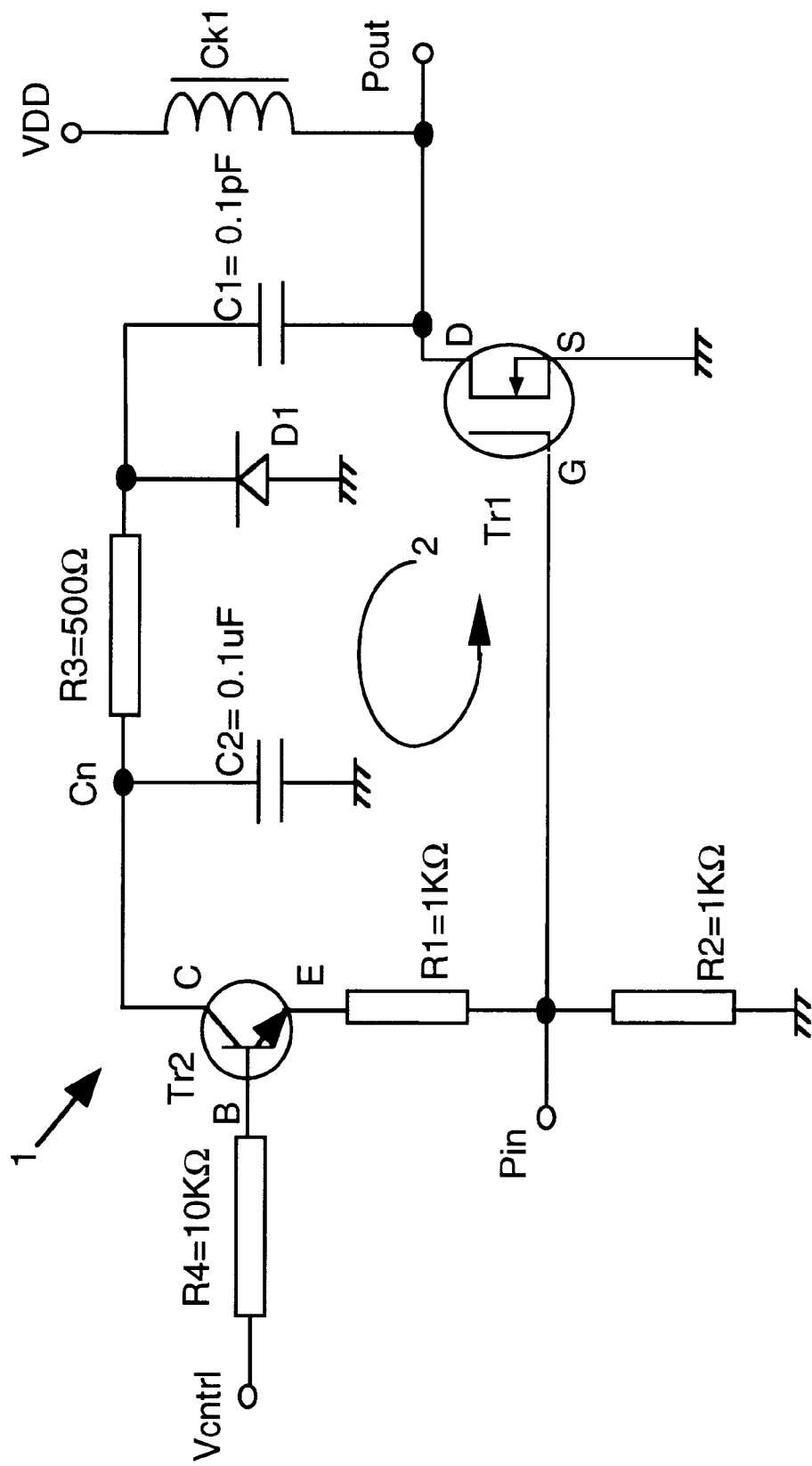
FIG. 1. is a schematic diagram of a radio frequency power amplifier.

Referring to FIG. 1 there is illustrated a power amplifier 1 having an amplifier transistor Tr1 with a source electrode S coupled to ground. The amplifier transistor Tr1 also has a control input in the form of a gate electrode G and an output in the form of a drain electrode D. Transistor Tr1 is a field effect transistor with the drain electrode D being coupled to the gate electrode G by a feedback circuit 2.

The feedback circuit 2 comprises a direct current blocking capacitor C1 in series with a resistor capacitor network R3, C2 providing low pass filter circuitry in which capacitor C2 is coupled to ground. The low pass filter circuitry is coupled at a common node Cn to a collector electrode C of a bipolar voltage regulating transistor Tr2 having an emitter electrode E coupled to a potential divider circuit. The potential divider circuit includes two resistors R1 and R2, wherein resistor R1 forms part of the feedback circuit 2 and resistor R2 is coupled to ground.

The base electrode B of transistor 2 is coupled to a control voltage input node Vcntrl by a resistor R4 and a gate of transistor Tr1 is coupled to a power input node Pin. Finally, the drain electrode D of transistor Tr1 is coupled to both a direct current supply voltage VDD by a radio frequency choke Ck1 and an amplifier output node Pout.

In use, radio frequency signals are supplied to the power amplifier at the power input node Pin. The radio frequency signals are amplified by transistor Tr1 and choke Ck1 blocks the amplifier radio frequency signals from being supplied to the supply voltage VDD as will be apparent to a person skilled in the art.

The amplified radio frequency signals are supplied both to the amplifier output node Pout and the feedback circuit 2 in which direct current is blocked by capacitor C1. The amplified radio frequency signals are processed and fedback to gate G of transistor Tr1 by feedback circuit 2, whereby diode D1 half wave rectifies the amplified radio frequency signals and the low pass filter circuitry filters high frequency ripple. Hence, a direct current supply is provided to the potential divider circuit of R1 and R2 which operates in a conventional manner to provide a direct current bias to the gate G1 of transistor Tr1. The amount of the direct current bias is dependent on the amplitude of the amplified radio frequency signals at node Pout and to a lesser extent their frequency. As will be apparent to a person skilled in the art, at the design stage values of Resistors R1, R2, R3 and Capacitor C2 are selected to provide a predetermined voltage at gate G for a given amplitude and frequency of amplified radio frequency signals at output node Pout. The transistor Tr2 acts as a voltage regulator which limits the maximum direct current bias that may be supplied to gate G1. In this regard, the maximum voltage across R1 and R2 is determined by a pre-set voltage provided at control input voltage node Vcntrl. For instance, if a voltage is pre-set at control input voltage node Vcntrl such that the base of transistor Tr2 is held constant at 5 volts then due to the voltage drop required across the base emitter junction in order to drive transistor Tr2, the maximum voltage that can appear across resistors R1 and R2 is approximately 4.3 volts. If the voltage across resistors R1 and R2 becomes greater than 4.3 volts transistor Tr1 will switch off thereby the maximum direct current bias supplied to gate G of transistor Tr1 is limited, this bias being depend upon the values of resistors R1 and R2.

Advantageously, the present invention allows for self biasing of the power amplifier 1 and therefore the need for time consuming production line pre-set biasing, which is susceptible to drift, is eliminated. Another advantage of the present invention is that because the voltage at gate G varies with the radio frequency input signal frequencies and amplitudes it is possible to obtain a higher power output for a given input signal than that of conventional prior art fixed biased amplifiers. Further, the need for additional pre-set biasing circuitry coupled to gate G1 in alleviated and the maximum voltage bias at gate G is limited by transistor Tr2.

Although the invention has been described with reference to a preferred embodiment it is to be understood that the invention is not restricted to the embodiment described herein.

We claim:

1. An amplifier including:
   at least one amplifier transistor with a control input and an output; and
   a feedback circuit coupling said output to said control input, said feedback circuit having a direct current blocking component and low pass filter circuitry with a rectifier there between, said rectifier being a diode having an anode coupled to ground and cathode coupled to both said direct current blocking component and said low pass filter circuitry;
   wherein, in use, radio frequency signals at said output are processed by said feedback circuit to provide a direct current bias to said control input, said direct current bias being dependent upon variations of said radio frequency signals at said output.

2. An amplifier as claimed in claim 1 further characterised by said direct current bias being dependent upon amplitude variations of said radio frequency signals at said output.

3. An amplifier as claimed in claim 2 further characterised by said direct current bias also being dependent upon frequency variations of said radio frequency signals at said output.

4. An amplifier as claimed in claim 1, wherein said control input is coupled to a potential divider circuit, wherein a first part of said potential divider circuit comprises part of said feedback circuit.

5. An amplifier as claimed in claim 4, wherein a second part of said potential divider circuit is coupled to ground.

6. An amplifier as claimed in claim 1, wherein there is bias limiting circuitry associated with said feedback circuit, said bias limiting circuitry being configured to limit the maximum direct current bias provided to said input.

7. An amplifier as claimed in claim 4, wherein there is bias limiting circuitry associated with said feedback circuit, said bias limiting circuitry being configured to limit the maximum direct current bias provided to said input.

8. An amplifier as claimed in claim 6, wherein said bias limiting circuitry includes at least one voltage regulating transistor in said feedback circuit.

9. An amplifier as claimed in claim 7, wherein said bias limiting circuitry includes at least one voltage regulating transistor in said feedback circuit.

10. An amplifier as claimed in claim 1, wherein said output is coupled to a direct current voltage supply by a radio frequency choke.

11. An amplifier including:
    at least one amplifier transistor with a control input and an output; and
    a feedback circuit coupling said output to said control input, said feedback circuit having a direct current blocking component and low pass filter circuitry with a rectifier therebetween, said feedback circuit having bias limiting circuitry associated therewith, said bias limiting circuitry including at least one voltage regulating transistor and said bias limiting circuitry being configured to limit the maximum direct current bias provided to said input;
    wherein, in use, radio frequency signals at said output are processed by said feedback circuit to provide a direct current bias to said control input, said direct current bias being dependent upon variations of said radio frequency signals at said output.

12. An amplifier including:
    at least one amplifier transistor with a control input and an output; and
    a feedback circuit coupling said output to said control input, said feedback circuit having a direct current blocking component and low pass filter circuitry with a rectifier there between, said control input is coupled to a potential divider circuit, wherein a first part of said potential divider circuit comprises part of said feedback circuit, said feedback circuit having bias limiting circuitry associated therewith, said bias limiting circuitry being configured to limit the maximum direct current bias provided to said input, the bias limiting circuitry including at least one voltage regulating transistor in said feedback circuit;
    wherein, in use, radio frequency signals at said output are processed by said feedback circuit to provide a direct current bias to said control input, said direct current bias being dependent upon variations of said radio frequency signals at said output.

* * * * *